(12) United States Patent
Sato et al.

(10) Patent No.: US 9,102,786 B2
(45) Date of Patent: Aug. 11, 2015

(54) EPOXY RESIN COMPOSITION, CURED OBJECT OBTAINED THEREFROM, AND LIGHT-EMITTING DIODE

(75) Inventors: Takashi Sato, Hiratsuka (JP); Shuichi Ueno, Hiratsuka (JP); Takeshi Koyama, Hiratsuka (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 915 days.

(21) Appl. No.: 12/678,166

(22) PCT Filed: Sep. 22, 2008

(86) PCT No.: PCT/JP2008/067103
§ 371 (c)(1),
(2), (4) Date: Mar. 15, 2010

(87) PCT Pub. No.: WO2009/041389
PCT Pub. Date: Apr. 2, 2009

(65) Prior Publication Data
US 2010/0193831 A1    Aug. 5, 2010

(30) Foreign Application Priority Data
Sep. 27, 2007   (JP) ................. 2007-251050

(51) Int. Cl.
| | |
|---|---|
| H01L 23/29 | (2006.01) |
| C08L 63/00 | (2006.01) |
| C08K 5/13 | (2006.01) |
| C08G 59/24 | (2006.01) |
| H01L 51/52 | (2006.01) |
| C08G 59/22 | (2006.01) |
| C08G 59/42 | (2006.01) |
| H01L 33/56 | (2010.01) |

(52) U.S. Cl.
CPC ............. *C08G 59/24* (2013.01); *C08G 59/226* (2013.01); *C08G 59/42* (2013.01); *C08L 63/00* (2013.01); *H01L 51/5237* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 4,716,185 | A * | 12/1987 | Rabener et al. | ............. 523/456 |
| 2003/0071367 | A1 * | 4/2003 | Yeager et al. | ............. 257/793 |
| 2003/0080341 | A1 | 5/2003 | Sakano et al. | |
| 2005/0224821 | A1 | 10/2005 | Sakano et al. | |
| 2010/0155739 | A1 * | 6/2010 | Kuramoto et al. | ............. 257/76 |

FOREIGN PATENT DOCUMENTS

| | | |
|---|---|---|
| EP | 1 754 734 A1 | 2/2007 |
| EP | 1 887 001 A1 | 2/2008 |
| JP | 2000 344868 | 12/2000 |
| JP | 2001 114868 | 4/2001 |
| JP | 2002 97251 | 4/2002 |
| JP | 2003 26763 | 1/2003 |
| JP | 2003 176334 | 6/2003 |
| JP | 2005 36218 | 2/2005 |
| JP | 2006 83306 | 3/2006 |
| JP | 2006 182961 | 7/2006 |
| JP | 2006 213848 | 8/2006 |
| JP | 2006 265274 | 10/2006 |
| JP | 2006 299073 | 11/2006 |
| JP | 2006 306900 | 11/2006 |
| JP | 2007 39521 | 2/2007 |
| JP | 2007 39522 | 2/2007 |
| JP | 2007-119585 | 5/2007 |
| JP | 2007-131772 | 5/2007 |
| JP | 2007-238778 | 9/2007 |
| JP | 2007-246830 | 9/2007 |
| JP | 200881596 | 4/2008 |

(Continued)

OTHER PUBLICATIONS

The Japan Society of Epoxy Resin Technology Soritsu 30 Shunen Kinen Shuppan Henshu linkai, Sosetsu Epoxy Resin Kisohenll, 1$^{st}$ edition, The Japan Society of Epoxy Resin Technology, pp. 45 to P54, Nov. 19, 2003.

(Continued)

*Primary Examiner* — Andrew K Bohaty
(74) *Attorney, Agent, or Firm* — Oblon, McClelland, Maier & Neustadt, L.L.P.

(57) ABSTRACT

Provided are an epoxy resin composition including acid anhydrides (A) and epoxy resins (B), in which: (a) cyclohexane-1,2,4-tricarboxylic acid-1,2-anhydride accounts for 50 to 90 mass % of the acid anhydrides (A); (b) an alicyclic epoxy resin compound accounts for 30 to 90 mass % of the epoxy resins (B) and an epoxy resin compound represented by the following general formula (1) accounts for 10 to 50 mass % of the epoxy resins (B); and (c) contents of the acid anhydrides (A) and the epoxy resins (B) are such that a blending equivalent ratio between the acid anhydrides and the epoxy resins ranges from 0.4 to 0.7, a cured product of the composition, and a light-emitting diode. The epoxy resin composition has the following characteristics. That is, (1) the composition has a low viscosity after the mixing, a low degree of viscosity increase in standing at room temperature, and excellent workability, (2) the composition has satisfactory curability even when no curing accelerator is added, and (3) a cured product is colorless and transparent, has crack resistance, and changes its color to a small extent with long-term light irradiation and heating. The composition is suitable for an encapsulant for a photoelectric conversion element such as a blue LED or white LED. (In the formula, R's each independently represent a hydrogen atom or a methyl group, m represents an integer of 1 to 3, and n represents an integer of 2 to 8.)

20 Claims, No Drawings

(56) References Cited

FOREIGN PATENT DOCUMENTS

| WO | 2005 121202 | | 12/2005 |
|---|---|---|---|
| WO | WO 2007015426 A1 | * | 2/2007 |
| WO | WO 2007/105795 A1 | | 9/2007 |

OTHER PUBLICATIONS

Extended European Search Report issued Jan. 23, 2012, in Patent Application No. 08834277.9.
Japanese Office Action issued May 20, 2014, in Japan Patent Application No. 2009-534319.

* cited by examiner

EPOXY RESIN COMPOSITION, CURED OBJECT OBTAINED THEREFROM, AND LIGHT-EMITTING DIODE

TECHNICAL FIELD

The present invention relates to an epoxy resin composition particularly suitable for an encapsulant for a photoelectric conversion element typified by a light emitting diode such as a blue or white light emitting diode, a coating, an adhesive, and a molded article.

BACKGROUND ART

In recent years, blue and white light emitting diodes (hereinafter, light emitting diode is abbreviated as "LED") each having high luminance have been developed, and have been finding use in an expanded variety of applications including bulletin boards, full-color displays, and backlights for portable phones. An acid anhydride curable epoxy resin has been conventionally used as an encapsulant for a photoelectric conversion element such as an LED because the resin is excellent in colorless and transparent nature.

An alicyclic acid anhydride such as methyltetrahydrophthalic anhydride, hexahydrophthalic anhydride, or tetrahydrophthalic anhydride has been generally used as a curing agent for an epoxy resin for use in such photoelectric conversion element.

However, when the alicyclic acid anhydride such as those mentioned above is used as a curing agent for an epoxy resin, a curing accelerator must be added in order that the alicyclic acid anhydride may be sufficiently cured because the alicyclic acid anhydride has low curing reactivity.

For example, triphenylethylphosphonium bromide, tetrabutylphosphonium bromide, (Patent Document 1), 2-ethyl-4-methylimidazole (Patent Document 2), a 2-ethyl hexanoate salt of 1,8-diazabicyclo(5,4,0)undecene-7 (Patent Document 3), or tetraphenylphosphonium bromide (Patent Document 4) has been used as a curing accelerator to be added in this case.

In order that an epoxy resin composition finds use in blue LED and white LED applications, an epoxy resin cured product is requested to be colorless and transparent under a long-term heating condition because the epoxy resin cured product is exposed to strong light emission energy of any such LED at a high temperature for a long time period.

When such curing accelerator as described above is used, the curing accelerator itself changes to a yellow color owing to long-term heating, and hence its colorless and transparent nature is apt to be impaired. Accordingly, the curing accelerator is not preferably used in an encapsulant for a photoelectric conversion element such as an LED.

In addition, curing agents each containing cyclohexane-1,2,4-tricarboxylic acid-1,2-anhydride (also called hydrogenated trimellitic anhydride and hereinafter abbreviated as "H-TMAn") have been known as curing agents for obtaining colorless, transparent epoxy resin cured products each having improved light fastness and improved heat resistance (Patent Documents 5 to 8).

However, the epoxy resin compositions disclosed in those patent documents each have the following drawback. That is, each of the compositions has a high viscosity and a high curing rate, and hence shows a high degree of viscosity increase in standing at room temperature during a daytime operating time. Accordingly, each of the compositions is poor in workability.

Patent Document 1: JP 2000-344868 A
Patent Document 2: JP 2001-114868 A
Patent Document 3: JP 2002-97251 A
Patent Document 4: JP 2003-26763 A
Patent Document 5: JP 2005-36218 A
Patent Document 6: JP 2006-182961 A
Patent Document 7: JP 2007-39521 A
Patent Document 8: JP 2007-39522 A

DISCLOSURE OF THE INVENTION

Problems to be Solved by the Invention

An object of the present invention is to provide an epoxy resin composition having the following characteristics and suitable for an encapsulant for a photoelectric conversion element such as a blue LED or white LED, and a cured product of the composition. That is, (1) the composition has a low viscosity after the mixing, a low degree of viscosity increase in standing at room temperature, and excellent workability, (2) the composition has satisfactory curability even when no curing accelerator is added, and (3) a cured product of the composition is colorless and transparent, has crack resistance, and changes its color to a small extent with long-term light irradiation and heating.

Means for Solving the Problems

The inventors of the present invention have made extensive studies with a view to solving the above problems. As a result, the inventors have found that the above object can be achieved with a resin composition which is formed of acid anhydrides containing cyclohexane-1,2,4-tricarboxylic acid-1,2-anhydride (H-TMAn) and epoxy resins containing an alicyclic epoxy resin compound and in which the concentration of each of them is set to fall within a specific range. Thus, the inventors have reached the present invention.

That is, the present invention provides the following epoxy resin composition, cured product of the composition, and light emitting diode:

1. an epoxy resin composition, characterized by including: acid anhydrides (A); and epoxy resins (B), in which:

(a) cyclohexane-1,2,4-tricarboxylic acid-1,2-anhydride accounts for 50 to 90 mass % of the acid anhydrides (A);

(b) an alicyclic epoxy resin compound accounts for 30 to 90 mass % of the epoxy resins (B) and an epoxy resin compound represented by the following general formula (1) accounts for 10 to 50 mass % of the epoxy resins (B); and (c) contents of the acid anhydrides (A) and the epoxy resins (B) are such that a blending equivalent ratio between the acid anhydrides and the epoxy resins represented by the following formula (2) ranges from 0.4 to 0.7:

[Chem 1]

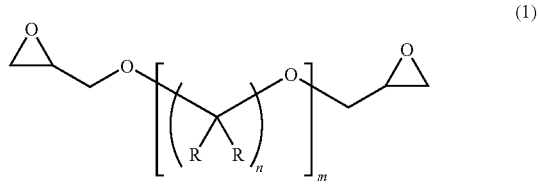
(1)

where R's each independently represent a hydrogen atom or a methyl group, m represents an integer of 1 to 3, and n represents an integer of 2 to 8, $$\text{blending equivalent ratio between acid anhydrides and epoxy resins} = (X+Y)/Z \quad (2)$$

where X represents the functional group number of acid anhydride groups in the acid anhydrides (A), Y represents the functional group number of carboxyl groups in the acid anhydrides (A), and Z represents the functional group number of epoxy groups in the epoxy resins (B);

2. the epoxy resin composition according to the above item 1, in which the epoxy resin compound represented by the general formula (1) includes at least one selected from hexane-1,6-diglycidyl ether, diethylene glycol diglycidyl ether, tripropylene glycol diglycidyl ether, and neopentyl glycol diglycidyl ether;

3. the epoxy resin composition according to the above item 1 or 2, in which the alicyclic epoxy resin compound includes 3,4-epoxycyclohexylmethyl-3',4'-epoxycyclohexane carboxylate;

4. the epoxy resin composition according to any one of the above items 1 to 3, further including 0.1 to 5 mass % of a hindered phenol-based antioxidant;

5. the epoxy resin composition according to any one of the above items 1 to 4, further including a fluorescent substance capable of absorbing at least part of light emitted from a light emitting element having a main emission peak wavelength of 550 nm or less to emit fluorescence;

6. an epoxy resin cured product obtained by curing the epoxy resin composition according to any one of the above items 1 to 5; and 7. a light emitting diode characterized by including a light emitting element encapsulated with the epoxy resin cured product according to the above item 6.

Effect of the Invention

The epoxy resin composition of the present invention has the following characteristics:
(1) the composition has a low viscosity after the mixing and a low degree of viscosity increase in standing at room temperature during a daytime operating time, and hence shows satisfactory workability;
(2) the composition has satisfactory curability even when no curing accelerator is added; and
(3) a cured product obtained is colorless and transparent, has crack resistance, and changes its color to an extremely small extent with long-term light irradiation and heating.

Therefore, the epoxy resin composition of the present invention is suitably used in, for example, encapsulants for photoelectric conversion elements such as blue LEDs and white LEDs, coating materials, coatings, adhesives, various molded articles, insulating members, and decorative materials.

BEST MODE FOR CARRYING OUT THE INVENTION

The epoxy resin composition of the present invention is a thermosetting resin composition containing the acid anhydrides (A) and the epoxy resins (B) each having a specific composition.

Cyclohexane-1,2,4-tricarboxylic acid-1,2-anhydride (H-TMAn) accounts for 50 to 90 mass % of the acid anhydrides (A) in the epoxy resin composition of the present invention.

When the concentration of H-TMAn in the acid anhydrides (A) is less than 50 mass %, the crack resistance of a cured product inherent in H-TMAn is lost. In addition, when the concentration of H-TMAn exceeds 90 mass %, objects, i.e., a reduction in viscosity and an improvement in workability of the epoxy resin composition cannot be achieved. The ratio of H-TMAn in the acid anhydrides (A) can be appropriately selected depending on applications and required performance as long as the ratio of H-TMAn falls within the range of 50 to 90 mass %. For example, the ratio of H-TMAn is preferably set to 60 mass % or more when emphasis is placed on the crack resistance of the cured product.

As an acid anhydride compound apart from H-TMAn, there are exemplified tetrahydrophthalic anhydride, hexahydrophthalic anhydride, methyltetrahydrophthalic anhydride, methylhexahydrophthalic anhydride, methylnadic anhydride, trialkyltetrahydrophthalic anhydride, methylcyclohexenetetracarboxylicdianhydride, phthalic anhydride, trimellitic anhydride, pyromellitic anhydride, benzophenonetetracarboxilic dianhydride, ethylene glycol bisanhydrotrimellitate, glycerin(anhydrotrimellitate) monoacetate, dodecenyl succinic anhydride, aliphatic dibasic polyanhydride, and chlorendic anhydride.

An acid anhydride compound having a low viscosity and free of any double bond such as hexahydrophthalic anhydride or methylhexahydrophthalic anhydride is desirably used as an acid anhydride compound except H-TMAn in particular consideration of a reduction in viscosity and an improvement in workability of the epoxy resin composition, the crack resistance, and light fastness. With regard to those acid anhydrides, one kind of acid anhydride compound can be used alone, or multiple kinds of them can be used as a mixture, for diluting H-TMAn.

The alicyclic epoxy resin compound accounts for 30 to 90 mass % of the epoxy resins (B) used in the epoxy resin composition of the present invention, and the epoxy resin compound represented by the general formula (1) accounts for 10 to 50 mass % of the epoxy resins (B).

Therefore, the case where the epoxy resins (B) are formed only of the alicyclic epoxy resin compound and the epoxy resin compound represented by the general formula (1), and the case where the epoxy resins (B) further contain any other epoxy resin compound are available. The total amount of the alicyclic epoxy resin compound and the epoxy resin compound represented by the general formula (1) in the epoxy resins (B) is preferably 70 mass % or more, or more preferably 80 mass % or more.

The alicyclic epoxy resin compound is an epoxy resin having an aliphatic ring in its molecule, in which a part of a C—C bond forming the ring is forming a covalent bond with an epoxy ring. Examples thereof include 3,4-epoxycyclohexylmethyl-3',4'-epoxycyclohexylmethyl-3', 4'-epoxycyclohexanecarboxylate and vinylcyclohexene diepoxide, and 3,4-epoxyycyclohexylmethyl-3', 4'-epoxycyclohexanecarboxylate is favorably used.

The epoxy resin compound represented by the general formula (1) is a compound in which a terminal hydroxyl group of an aliphatic diol or its dimer or trimer is glycidyl etherified. Examples of the aliphatic diol include hexane-1, 6-diol, butane-1,4-diol, propane-1,2-diol, ethylene glycol, propylene glycol, and neopentyl glycol.

In addition, specific examples of the epoxy resin compound represented by the general formula (1) include hexane-1,6-diglycidyl ether, butane-1,4-diglycidyl ether, diethylene glycol diglycidyl ether, triethylene glycol diglycidyl ether, tripropylene glycol diglycidyl ether, and neopentyl glycol diglycidyl ether. Of those, preferred are hexane-1,6-diglycidyl ether, diethylene glycol diglycidyl ether, tripropylene glycol diglycidyl ether, and neopentyl glycol diglycidyl ether, and more preferred is hexane-1,6-diglycidyl ether.

The cured product of the epoxy resin composition of the present invention cannot obtain excellent light fastness (resistance to a change in color with UV) when the alicyclic epoxy resin compound accounts for less than 30 mass % of the epoxy resins (B). As the loading of the alicyclic epoxy resin compound increases, the light fastness can be improved to a larger extent. In addition, when the alicyclic epoxy resin compound accounts for more than 90 mass %, the cured product becomes rigid and is apt to crack owing to a heat shock.

Meanwhile, as the amount of the epoxy resin compound represented by the general formula (1) in the epoxy resins (B) increases, the flexibility of the cured product is improved and, for example, the occurrence of a crack by a heat shock can be suppressed. When the epoxy resin compound represented by the general formula (1) accounts for less than 10 mass % of the epoxy resins, the crack resistance reduces. In addition, when the compound accounts for more than 50 mass %, resistance to a change in color with heat reduces.

In addition, examples of other epoxy resin compounds apart from the above alicyclic epoxy resin compound and the epoxy resin compound represented by the general formula (1) include a bisphenol A-type epoxy resin, a bisphenol F-type epoxy resin, a cresol novolak-type epoxy resin, a phenol novolak-type epoxy resin, a biphenyl-type epoxy resin, a stilbene-type epoxy resin, a hydroquinone-type epoxy resin, a naphthalene skeleton-type epoxy resin, a tetraphenylolethane-type epoxy resin, a DPP-type epoxy resin, a trishydroxyphenylmethane-type epoxy resin, a dicyclopentadienephenol-type epoxy resin, and glycidyl ethers each having one epoxy group such as a diglycidyl ether of a bisphenol A ethylene oxide adduct, a diglycidyl ether of a bisphenol A propylene oxide adduct, a phenyl diglycidyl ether, and a cresyl diglycidyl ether. In addition, there may be exemplified nucleus-hydrogenated epoxy resins which are nucleus-hydrogenated products of those epoxy resins.

Each of the other epoxy resin compounds can be used alone, or two or more kinds of them can be used as an appropriate mixture as long as a loading falls within the above range. In particular, an epoxy resin subjected to nucleus hydrogenation is more preferably used because the resin improves the colorless and transparent nature of the cured product.

The loadings of the acid anhydrides (A) and the epoxy resins (B) in the epoxy resin composition of the present invention are such that a blending equivalent ratio between the acid anhydrides and the epoxy resins represented by the following formula ranges from 0.4 to 0.7.

Blending equivalent ratio between acid anhydrides and epoxy resins=$(X+Y)/Z$ where X represents the functional group number of acid anhydride groups in the acid anhydrides (A), Y represents the functional group number of carboxyl groups in the acid anhydrides (A), and Z represents the functional group number of epoxy groups in the epoxy resins (B).

In the above formula, the equivalent of the acid anhydrides (A) is the total amount of the number X of acid anhydride groups in the acid anhydrides (A) and the number Y of carboxyl groups in the acid anhydrides (A). This is because one acid anhydride group probably reacts with one epoxy group and one carboxyl group probably reacts with one epoxy group.

For example, when an acid anhydride compound is cyclohexane-1,2,4-tricarboxylic acid-1,2-anhydride (H-TMAn), the number of acid anhydride groups in one of its molecules is one and the number of carboxyl groups in the molecule is one, and hence the equivalent of the acid anhydride is two. In addition, when an epoxy resin compound is 3,4-epoxycyclohexylmethyl-3',4'-epoxycyclohexane carboxylate, the number of epoxy groups in one of its molecules is two, and hence its equivalent is two. The same holds true for the epoxy resin compound represented by the general formula (1).

In the epoxy resin composition, the functional group number X of acid anhydride groups in the acid anhydrides (A) is the sum of (the functional group number of acid anhydride groups of each acid anhydride compound)×(the molar fraction of the acid anhydride compound), and the functional group number Y of carboxyl groups in the acid anhydrides (A) is the sum of (the functional group number of carboxyl groups of each acid anhydride compound)×(the molar fraction of the acid anhydride compound). In addition, the functional group number Z of epoxy groups in the epoxy resins (B) is the sum of (the functional group number of epoxy groups of each epoxy resin compound)×(the molar fraction of the epoxy resin compound).

When the blending equivalent ratio between the acid anhydrides and the epoxy resins in the epoxy resin composition of the present invention is less than 0.4, the resistance to a change in color with heat reduces. On the other hand, when the ratio exceeds 0.7, an unreacted acid anhydride remains and the resistance to a change in color with heat of the cured product reduces.

The viscosity of the epoxy resin composition of the present invention as a thermosetting composition at 30° C. immediately after the mixing of the acid anhydrides (A) and the epoxy resins (B) can be set to 5 Pa·s or less by adjusting the loadings of the alicyclic epoxy resin compound, the epoxy resin compound represented by the general formula (1), and any other epoxy resin compound in the epoxy resins (B) while setting the loadings of the acid anhydrides (A) and the epoxy resins (B) so that the blending equivalent ratio between the acid anhydrides and the epoxy resins may fall within the above range. In addition, a degree of viscosity increase after standing at normal temperature for 7 hours after the mixing [(viscosity after 7 hours)/(viscosity immediately after blending)] can be set to 3 or less.

When the viscosity of the epoxy resin composition of the present invention exceeds 5 Pa·s or the above degree of viscosity increase exceeds 3 upon use of the epoxy resin composition as an encapsulant for a photoelectric conversion element such as an LED, the workability deteriorates because the epoxy resin composition having a high viscosity is to be used or the viscosity of the epoxy resin composition increases during a daytime operating time.

According to the present invention, there can be provided an epoxy resin composition having the following characteristics and suitable for an encapsulant for a photoelectric conversion element such as a blue LED or white LED by (a) causing cyclohexane-1,2,4-tricarboxylic acid-1,2-anhydride (H-TMAn) to account for 50 to 90 mass % of the acid anhydrides (A) in the resin composition, (b) causing the alicyclic epoxy resin compound to account for 30 to 90 mass % of the epoxy resins (B) and causing the epoxy resin compound represented by the general formula (1) to account for 10 to 50 mass % of the epoxy resins (B), and (c) setting the contents of the acid anhydrides (A) and the epoxy resins (B) so that the blending equivalent ratio between the acid anhydrides and the epoxy resins may range from 0.4 to 0.7. That is, (1) a target thermosetting composition has a low viscosity after the mixing and a low degree of viscosity increase in standing at room temperature during a daytime operating time, and hence is excellent in workability, (2) the composition has satisfactory curability even when no curing accelerator is added, and (3) the cured product is colorless and transparent, has crack resistance, and changes its color to an extremely small extent with long-term light irradiation and heating.

When high resistance to a change in color with heat is requested of the epoxy resin composition of the present invention, an antioxidant is preferably incorporated. Examples of the antioxidant include a hindered phenol-based antioxidant, a sulfur-based antioxidant (such as a mercaptopropionic acid derivative), and a phosphorus-based antioxidant (such as HCA). Of those, the hindered phenol-based antioxidant is particularly effective. Specific examples of the hindered phenol-based antioxidant include, but are not limited to, n-octadecyl-3-(3,5-di-tert-butyl-4-hydroxyphenyl) propionate, triethylene glycol bis[3-[3-tert-butyl-4-hydroxy-5-methylphenyl)propionate], 3,9-bis{2-[3-(3-tert-butyl-4-hydroxy-5-methylphenyl)propionyloxy]-1,1-dimethylethyl}-2,4,8,10-tetraoxaspiro[5.5]undecane, and 2,6-bis(1,1-dimethylethyl)-4-methylphenol (BHT).

The content of the antioxidant is preferably 0.1 to 5 mass % with respect to the epoxy resin composition of the present invention. Setting the content of the antioxidant to 0.1 mass % or more improves the resistance to a change in color with heat. In addition, setting the content to 5 mass % or less forestalls the loss of transparent nature caused by the bleeding of the antioxidant.

When the epoxy resin composition of the present invention is used in a material for encapsulating a light emitting element of a white LED, the composition preferably contains a fluorescent substance capable of absorbing at least part of light emitted from a light emitting element having a main emission peak wavelength of 550 nm or less to emit fluorescence.

A curing accelerator can be appropriately used in the epoxy resin composition of the present invention as required to such an extent that an effect of the present invention is not impaired, though the use is not preferred for an encapsulant for a photoelectric conversion element such as an LED because the colorless and transparent nature of the cured product is apt to be impaired.

Examples of the curing accelerator include: tertiary amines such as benzyldimethylamine, tris(dimethylaminomethyl) phenol, and dimethylcyclohexylamine; imidazoles such as 1-cyanoethyl-2-ethyl-4-methylimidazole, 2-ethyl-4-methylimidazole, and 1-benzyl-2-methylimidazole; organophosphorus-based compounds such as triphenylphosphine and triphenyl phosphite; quaternary phosphonium salts such as tetraphenylphosphonium bromide and tetra-n-butylphosphonium bromide; diazabicycloalkenes such as 1,8-diazabicyclo [5.4.0]undecene-7 and organic salts thereof; organometallic compounds such as zinc octylate, tin octylate, and an aluminum acetylacetone complex; quaternary ammonium salts such as tetraethylammoniumbromide and tetrabutylammoniumbromide; boron compounds such as boron trifluoride and triphenyl borate; and metal halides such as zinc chloride and stannic chloride.

Further, as a curing accelerator, there may also be used a potential curing accelerator typified by: a high-melting-point dispersion type potential accelerator such as a high-melting-point imidazole compound, dicyandiamide, or an amine-added accelerator obtained by adding an amine to an epoxy resin or the like; a microcapsule type potential accelerator obtained by coating the surface of an imidazole-, phosphorus-, or phosphine-based accelerator with a polymer; an amine salt type potential curing accelerator; a high temperature dissociation type, heat cationic polymerization type potential curing accelerator such as a Lewis acid salt or a Bronsted acid salt; or the like.

Each of those curing accelerators may be used alone, or two or more kinds thereof may be used as a mixture.

The epoxy resin composition of the present invention maybe blended with anyone of additives such as: aliphatic polyols such as ethylene glycol and propylene glycol; carbon dioxide gas generation inhibitors such as an aliphatic or aromatic carboxylic acid compound and a phenol compound; flexibility imparting agents such as polyalkylene glycol; plasticizers; lubricants; coupling agents such as a silane coupling agent; surface treatment agents for inorganic fillers; flame retardants; colorants; antistatic agents; leveling agents; ion trapping agents; sliding property improvers; impact resistance improvers such as various rubbers and organic polymer beads; thixotropy imparting agents; surfactants; surface tension depressants; defoaming agents; anti-settling agents; light diffusing agents; UV absorbers; release agents; conductive fillers; and a low viscosity solvent for adjusting the viscosity, as required to such an extent that the characteristics of the thermosetting composition and the cured product to be obtained are not impaired.

The epoxy resin composition of the present invention may be stored while being divided into two or more components such as a component containing the acid anhydrides (A) and a component containing the epoxy resins (B), and those components may be mixed before curing. Alternatively, the composition may be stored as an epoxy resin composition blended with the respective components, and may be directly subjected to curing. When the composition is stored as an epoxy resin composition blended with the respective components, the composition is preferably stored at a low temperature (typically −40 to 15° C.)

A method of curing the epoxy resin composition of the present invention is not particularly limited, and a conventionally known curing device such as a closed curing oven or a tunnel oven capable of continuously curing the composition can be adopted. A heating source is not particularly limited, and the composition can be heated by a conventionally known method such as the circulation of hot air, infrared heating, or high-frequency heating. The composition is preferably cured at a temperature of 80 to 250° C. for a time period of 30 seconds to 10 hours. When the reduction in the internal stress of a cured product is aimed, it is preferred to adopt a procedure in which the composition is precured at 80 to 120° C. for 0.5 to 5 hours before the composition is postcured at 120 to 180° C. for 0.1 to 5 hours. When curing the composition in a short time period is aimed, the composition is preferably cured at 150 to 250° C. for 30 seconds to 30 minutes.

The epoxy resin composition of the present invention has a weight retentivity at the time of its curing (a ratio of the weight of the cured product to the weight of the thermosetting composition before the curing) of 97% or more. An epoxy resin composition having a high weight retentivity can be obtained by properly selecting the kind and amount of the low-viscosity acid anhydride compound (that is, an acid anhydride compound except H-TMAn), and a blending ratio between the acid anhydrides (A) and the epoxy resins (B).

The epoxy resin composition of the present invention obtained as described above can be used as, a thermosetting composition such as an encapsulant for a blue LED or a white LED, the cured product of the composition being colorless and transparent, having crack resistance, and changing its color to a small extent with long-term heating.

However, the applications of the epoxy resin composition of the present invention are not limited to those described above, and the composition can find use in other applications where transparency is requested including insulative encapsulants for light emitting elements such as other LEDs and semiconductor laser, photoconductive elements, light receiving elements such as a photodiode, a solar cell, a phototransistor, and a photothyristor, and photoelectric conversion elements typified by optically coupled elements such as a photocoupler and a photointerrupter, adhesives for liquid crystal and the like, resins for stereo lithography, surface coating agents for plastics, glass, metals, and the like, and decorative materials.

In addition, the epoxy resin composition of the present invention is applicable to an insulative encapsulant or molded article having a thickness of 2 mm or more by a conventionally known method such as potting, casting, filament winding, or lamination. Specific examples of applications where the composition may be used include insulative encapsulants for heavy electric devices such as a mold potential transformer, a mold transformer (a current transformer (CT), a zero layer current transformer (ZCT), a potential transformer (PT), or an installation type potential transformer (ZPT)), a gas opening and closing part (insulating spacer, supporting glass, operating rod, closed terminal, bushing, insulating column, or the like), a solid insulated switch part, an overhead distribution line automatic control device part (rotating glass, voltage detecting element, overall capacitor, or the like), an underground distribution line device part (mold discone, power transformer, or the like), a power capacitor, resin glass, and a coil for a linear motor car, and impregnating varnish for coils for various rotating equipment (such as generator and motor).

In addition, the epoxy resin composition of the present invention maybe applied to potting resins for fly-back transformers, ignition coils, AC capacitors, and the like, transparent sealing resins for LEDs, detectors, emitters, photocouplers, and the like, and insulative sealing resins for use in the field of weak electricity such as impregnating resins for film capacitors and various coils.

The epoxy resin composition of the present invention can find use also in other applications where a laminated plate or insulating property is not necessarily needed such as various FRP molded articles, various coating materials, adhesives, and decorative materials.

EXAMPLES

Hereinafter, the present invention is described in detail by way of examples and comparative examples. However, the present invention should not be construed as being limited to the following examples.

It should be noted that the measurement and evaluation of the physical properties of epoxy resin compositions obtained in the following examples and comparative examples, and of cured products of the compositions were performed as described below.

(1) Viscosity of Epoxy Resin Composition

Viscosity measurement was performed with a dynamic viscoelasticity-measuring apparatus (ARES manufactured by TA Instruments) at a distance of 0.05 mm between aluminum plates each having a diameter of 25 mm and a furnace temperature of 30° C.

In addition, the degree of viscosity increase of an epoxy resin composition was defined as a ratio of a viscosity after a lapse of 7 hours at room temperature (15 to 27° C.) in a lidded screw bottle made of glass to a viscosity immediately after the mixing.

Evaluation for Viscosity Immediately after Mixing
○: 5 Pa·s or less
×: More than 5 Pa·s
Evaluation for Degree of Viscosity Increase
○: 3 or less
×: More than 3

(2) Test for Resistance to Change in Color with UV (Light Fastness Test)

Predetermined amounts of samples were mixed in a beaker with a stirrer, and a dissolved inert gas in an epoxy resin composition was deaerated in a vacuum. After that, the resultant was poured into a 50-mm square silicone mold having a depth of 3 mm, and precuring at 120° C. for 3 hours in a hot air dryer was performed. After that, postcuring at 150° C. for 2 hours was performed. As a result, a cured product was obtained.

The resultant cured product was installed in a test furnace of an EYE SUPER UV TESTER SUV-W11 manufactured by DAINIPPON PLASTICS CO., LTD., and was irradiated with light having a wavelength in the range of 295 to 450 nm (having a peak with the highest intensity at 360 to 380 nm) at an irradiated surface light intensity of 68 mW/cm$^2$ for 120 hours under conditions of 55° C./50 RH %.

The light transmittances of the cured product before and after the irradiation were measured with a spectrophotometer [spectrophotometer UV-3100 manufactured by Shimadzu Corporation], and a transmittance for a light beam having a wavelength of 400 nm corresponding to a thickness of 1 mm was determined from the measured values and a surface reflectance calculated from a separately measured refractive index.

Evaluation for Resistance to Change in Color with UV
○: The percentage by which the light transmittance reduces (transmittance before irradiation−transmittance after irradiation) is 10% or less.
×: The percentage by which the light transmittance reduces exceeds 10%.

(3) Test for Resistance to Change in Color with Heat

The resultant cured product obtained in the same manner as in the test for resistance to a change in color with UV was installed in a test furnace of a gear oven manufactured by Ueshima Seisakusho CO., LTD., and was heated at 150° C. for 120 hours.

The light transmittances of the cured product before and after the heating were measured with a spectrophotometer [spectrophotometer UV-3100 manufactured by Shimadzu Corporation], and a transmittance for a light beam having a wavelength of 400 nm corresponding to a thickness of 1 mm was determined from the measured values and a surface reflectance calculated from a separately measured refractive index.

Evaluation for Resistance to Change in Color with Heat
○: The percentage by which the light transmittance reduces (transmittance before heating−transmittance after heating) is 10% or less.
×: × was given to the case where the percentage by which the light transmittance reduces exceeds 10%.

(4) Crack Resistance Test

Predetermined amounts of samples were mixed in a beaker with a stirrer, and a dissolved inert gas in a composition was deaerated in a vacuum. After that, the resultant was poured into a surface mount light emitting diode, and precuring at 120° C. for 3 hours in a hot air dryer was performed. After that, postcuring at 150° C. for 2 hours was performed. A light emitting diode encapsulated with the cured composition was obtained.

The light emitting diode was left at 60° C. and 60% RH for 144 hours. After that, the diode was subjected to a heat history having a highest temperature of 260° C. and varying from 230 to 260° C. in seconds three times with a reflow furnace [XNB-738PC(C) manufactured by Furukawa Electric Co., Ltd.].

The foregoing operation was conducted on four samples of each curable composition, and evaluation was performed on the basis of the following circumstance where peeling and a crack occurred after the heat history.

○: The number of samples where peeling or a crack occurred was zero.

Δ: The number of samples where peeling or a crack occurred was one to two.

×: The number of samples where peeling or a crack occurred was three or more.

Example 1

79.0 parts by mass of H-TMAn [manufactured by MITSUBISHI GAS CHEMICAL COMPANY, INC.], 21.0 parts by mass of a mixture of hexahydrophthalic anhydride and methylhexahydrophthalic anhydride [MH700G manufactured by New Japan Chemical Co., Ltd.], 181 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 47.8 parts by mass of hexane-1,6-diglycidyl ether [SR-16H manufactured by SAKAMOTO YAKUHIN KOGYO CO., LTD.] as an epoxy resin compound represented by the formula (1), and 2.6 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Example 2

87.0 parts by mass of H-TMAn, 13.0 parts by mass of a mixture of hexahydrophthalic anhydride and methylhexahydrophthalic anhydride [MH700G manufactured by New Japan Chemical Co., Ltd.], 150.0 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 48.2 parts by mass of hexane-1,6-diglycidyl ether as an epoxy resin compound represented by the formula (1), and 2.4 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Example 3

52.0 parts by mass of H-TMAn, 48.0 parts by mass of a mixture of hexahydrophthalic anhydride and methylhexahydrophthalic anhydride [MH700G manufactured by New Japan Chemical Co., Ltd.], 210 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 28.6 parts by mass of hexane-1,6-diglycidyl ether as an epoxy resin compound represented by the formula (1), and 2.7 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Example 4

79.0 parts by mass of H-TMAn, 21.0 parts by mass of a mixture of hexahydrophthalic anhydride and methylhexahydrophthalic anhydride [MH700G manufactured by New Japan Chemical Co., Ltd.], 107 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 57.4 parts by mass of hexane-1,6-diglycidyl ether as an epoxy resin compound represented by the formula (1), 107 parts by mass of a product obtained by subjecting a bisphenol A type epoxy resin to nucleus hydrogenation [YX8000 manufactured by Japan Epoxy Resins Co., Ltd.], and 3.0 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Example 5

17.00 parts by mass of H-TMAn, 4.52 parts by mass of a mixture of hexahydrophthalic anhydride and methylhexahydrophthalic anhydride [MH700G manufactured by New Japan Chemical Co., Ltd.], 43.3 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 10.8 parts by mass of tripropylene glycol diglycidyl ether [SR-TPG manufactured by SAKAMOTO YAKUHIN KOGYO CO., LTD.] as an epoxy resin compound represented by the formula (1), and 0.61 part by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Comparative Example 1

79.0 parts by mass of H-TMAn, 21.0 parts by mass of a mixture of hexahydrophthalic anhydride and methylhexahydrophthalic anhydride [MH700G manufactured by New Japan Chemical Co., Ltd.], 78.5 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 57.4 parts by mass of hexane-1,6-diglycidyl ether, 153 parts by mass of a product obtained by subjecting a bisphenol A type epoxy resin to nucleus hydrogenation [YX8000 manufactured by Japan Epoxy Resins Co., Ltd.], and 3.1 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Comparative Example 2

79.0 parts by mass of H-TMAn, 21.0 parts by mass of a mixture of hexahydrophthalic anhydride and methylhexahydrophthalic anhydride [MH700G manufactured by New Japan Chemical Co., Ltd.], 229 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], and 2.6 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 1 shows the results.

Comparative Example 3

79.0 parts by mass of H-TMAn, 21.0 parts by mass of a mixture of hexahydrophthalic anhydride and methylhexahydrophthalic anhydride [MH700G manufactured by New Japan Chemical Co., Ltd.], 103 parts by mass of an alicyclic epoxy resin compound [3,4-epoxycyclohexenylmethyl-3',4'-epoxycyclohexene carboxylate: CEL2021P manufactured by DAICEL CHEMICAL INDUSTRIES, LTD.], 202 parts by mass of a product obtained by subjecting a bisphenol A type epoxy resin to nucleus hydrogenation (YX8000 manufactured by Japan Epoxy Resins Co., Ltd.), and 3.2 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

Comparative Example 4

32.0 parts by mass of H-TMAn, 68.0 parts by mass of a mixture of hexahydrophthalic anhydride and methylhexahydrophthalic anhydride [MH700G manufactured by New Japan Chemical Co., Ltd.], 156 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 40.0 parts by mass of hexane-1,6-diglycidyl ether, and 2.4 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

Comparative Example 5

100 parts by mass of H-TMAn, 133.0 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 33.2 parts by mass of hexane-1,6-diglycidyl ether, and 2.1 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

Comparative Example 6

52.0 parts by mass of H-TMAn, 48.0 parts by mass of a mixture of hexahydrophthalic anhydride and methylhexahydrophthalic anhydride [MH700G manufactured by New Japan Chemical Co., Ltd.], 61.9 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 61.9 parts by mass of hexane-1,6-diglycidyl ether, and 1.8 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

Comparative Example 7

83.0 parts by mass of H-TMAn, 17.0 parts by mass of a mixture of hexahydrophthalic anhydride and methylhexahydrophthalic anhydride [MH700G manufactured by New Japan Chemical Co., Ltd.], 167 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 167 parts by mass of hexane-1,6-diglycidyl ether, and 1.8 parts by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

Comparative Example 8

17.0 parts by mass of H-TMAn, 4.52 parts by mass of a mixture of hexahydrophthalic anhydride and methylhexahydrophthalic anhydride [MH700G manufactured by New Japan Chemical Co., Ltd.], 40.7 parts by mass of an alicyclic epoxy resin compound [3,4-epoxycyclohexylmethyl-3',4'-epoxycyclohexane carboxylate: CEL2021P manufactured by DAICEL CHEMICAL INDUSTRIES, LTD.], 10.2 parts by mass of trimethylolpropane polyglycidyl ether [SR-TMP manufactured by SAKAMOTO YAKUHIN KOGYO CO., LTD.], and 0.58 part by mass of a hindered phenol-based antioxidant AO-50 (manufactured by ADEKA CORPORATION) were mixed, and the measurement and evaluation of the physical properties of the resultant epoxy resin composition and of a cured product of the composition were performed by the foregoing methods. Table 2 shows the results.

TABLE 1

|  | Example 1 | Example 2 | Example 3 | Example 4 | Example 5 | Comparative Example 1 | Comparative Example 2 |
|---|---|---|---|---|---|---|---|
| Epoxy resin composition (parts by mass) | | | | | | | |
| (1) Acid anhydrides (A) | | | | | | | |
| Cyclohexane-1,2,4-tricarboxylic acid-1,2-anhydride (H-TMAn) | 79.0 | 87.0 | 52.0 | 79.0 | 17.0 | 79.0 | 79.0 |
| Phthalic anhydride mixture (MH700G) | 21.0 | 13.0 | 48.0 | 21.0 | 4.5 | 21.0 | 21.0 |

TABLE 1-continued

|  | Example 1 | Example 2 | Example 3 | Example 4 | Example 5 | Comparative Example 1 | Comparative Example 2 |
|---|---|---|---|---|---|---|---|
| (2) Epoxy resins (B) | | | | | | | |
| Alicyclic epoxy resin compound (CEL2021P) | 181.0 | 150.0 | 210.0 | 107.0 | 43.3 | 78.5 | 229.0 |
| Epoxy resin compound represented by general formula (1) (hexane-1,6-glycidyl ether) | 47.8 | 48.2 | 28.6 | 57.4 | | 57.4 | |
| Epoxy resin compound represented by general formula (1) (tripropylene glycol diglycidyl ether) | | | | | 10.8 | | |
| Product obtained by subjecting bisphenol A type epoxy resin to nucleus hydrogenation (YX8000) | | | | 107.0 | | 153.0 | |
| (3) Antioxidant (AO-50) Concentration (mass %) | 2.6 | 2.4 | 2.7 | 3.0 | 0.61 | 3.1 | 2.6 |
| Concentration of H-TAMn in acid anhydrides (A) | 79 | 87 | 52 | 79 | 79 | 79 | 79 |
| Concentration of alicyclic epoxy resin compound in epoxy resins (B) | 79 | 76 | 88 | 39 | 80 | 27 | 100 |
| Concentration of epoxy resin compound represented by general formula (1) in epoxy resins (B) | 21 | 24 | 12 | 21 | 20 | 20 | 0 |
| Blending equivalent ratio between acid anhydrides and epoxy resins in epoxy resin composition | 0.53 | 0.59 | 0.44 | 0.53 | 0.50 | 0.53 | 0.51 |
| Evaluation | | | | | | | |
| (1) Viscosity (immediately after mixing) | ○ | ○ | ○ | ○ | ○ | ○ | ○ |
| Degree of viscosity increase | ○ | ○ | ○ | ○ | ○ | ○ | x |
| (2) Test for resistance to change in color with UV (light fastness test) | ○ | ○ | ○ | ○ | ○ | ○ | x |
| (3) Test for resistance to change in color with heat | ○ | ○ | ○ | ○ | ○ | ○ | ○ |
| (4) Crack resistance test | ○ | ○ | ○ | ○ | ○ | x | x |

TABLE 2

|  | Comparative Example 3 | Comparative Example 4 | Comparative Example 5 | Comparative Example 6 | Comparative Example 7 | Comparative Example 8 |
|---|---|---|---|---|---|---|
| Epoxy resin composition (parts by mass) | | | | | | |
| (1) Acid anhydrides (A) | | | | | | |
| Cyclohexane-1,2,4-tricarboxylic acid-1,2-anhydride (H-TMAn) | 79.0 | 32.0 | 100.0 | 52.0 | 83.0 | 17.0 |
| Phthalic anhydride mixture (MH700G) | 21.0 | 68.0 | | 48.0 | 17.0 | 4.52 |
| (2) Epoxy resins (B) | | | | | | |
| Alicyclic epoxy resin compound (CEL2021P) | 103.0 | 156.0 | 133.0 | 61.9 | 167.0 | 40.7 |
| Epoxy resin compound represented by general formula (1) (hexane-1,6-glycidyl ether) | | 40.0 | 33.2 | 61.9 | 167.0 | |
| Product obtained by subjecting bisphenol A type epoxy resin to nucleus hydrogenation (YX8000) | 202.0 | | | | | |
| Trimethylolpropane glycidyl ether | | | | | | 10.2 |
| (3) Antioxidant (AO-50) Concentration (mass %) | 3.2 | 2.4 | 2.1 | 1.8 | 1.8 | 0.58 |
| Concentration of H-TAMn in acid anhydrides (A) | 79 | 32 | 100 | 52 | 83 | 79 |
| Concentration of alicyclic epoxy resin compound in epoxy resins (B) | 34 | 80 | 80 | 50 | 50 | 80 |
| Concentration of epoxy resin compound represented by general formula (1) in epoxy resins (B) | 0 | 20 | 20 | 50 | 50 | 0 |
| Blending equivalent ratio between acid anhydrides and epoxy resins in epoxy resin composition | 0.51 | 0.49 | 0.79 | 0.91 | 0.39 | 0.50 |
| Evaluation | | | | | | |
| (1) Viscosity (immediately after mixing) | ○ | ○ | x | ○ | ○ | ○ |
| Degree of viscosity increase | ○ | ○ | x | ○ | ○ | x |
| (2) Test for resistance to change in color with UV (light fastness test) | ○ | ○ | x | ○ | ○ | x |
| (3) Test for resistance to change in color with heat | ○ | ○ | ○ | x | x | ○ |
| (4) Crack resistance test | x | x | x | x | x | x |

Tables 1 and 2 above show the following.

(a) As can be seen from comparison between the concentration (mass %) of H-TMAn in the acid anhydrides (A) and the viscosity immediately after the mixing, the degree of viscosity increase, or the crack resistance in each of Comparative Example 4, Example 3, Example 1, Example 2, and Comparative Example 5, when the content of H-TMAn in the acid anhydrides is set to 50 to 90 mass %, the workability of the epoxy resin composition is satisfactory and a cured product excellent in crack resistance is obtained.

(b) As can be seen from comparison between the concentration (mass %) of the alicyclic epoxy resin compound in the epoxy resins (B) and the degree of viscosity increase or the crack resistance in each of Comparative Example 1, Example 4, Example 2, Example 1, Example 3, and Comparative Example 2, when the content of the alicyclic epoxy resin compound in the epoxy resins (B) is set to 30 to 90 mass %, the workability of the epoxy resin composition is satisfactory and a cured product excellent in crack resistance is obtained.

(c) As can be seen from comparison between the concentration (mass %) of the epoxy resin compound represented by the general formula (1) in the epoxy resins (B) and the crack resistance in each of Comparative Example 3, Example 1, and Example 4, when the content of the epoxy resin compound represented by the general formula (1) in the epoxy resins (B) is set to 10 to 50 mass %, the workability of the epoxy resin composition is satisfactory and a cured product excellent in crack resistance is obtained.

(d) As can be seen from comparison between the blending equivalent ratio between the acid anhydrides and the epoxy resins, and the resistance to a change in color with heat in each of Comparative Example 6, Example 1, Example 2, and Comparative Example 7, when the blending equivalent ratio between the acid anhydrides and the epoxy resins is set to 0.4 to 0.7, a cured product excellent in resistance to a change in color with heat is obtained.

The invention claimed is:

1. An epoxy resin composition, comprising:
acid anhydrides (A); and
epoxy resins (B),
wherein:
(a) cyclohexane-1,2,4-tricarboxylic acid-1,2-anhydride accounts for 50 to 90 mass % of the acid anhydrides (A) and the remainder being hexahydrophthalic anhydride and methylhexahydrophthalic anhydride;
(b) the epoxy resins (B) consists of 76 to 90 mass % of 3,4-epoxycyclohexylmethyl-3',4'-epoxycyclohexanecarboxylate and 10 to 24 mass % of hexane-1,6-diglycidyl ether; and
(c) contents of the acid anhydrides (A) and the epoxy resins (B) are such that a blending equivalent ratio between the acid anhydrides and the epoxy resins represented by the following formula (2) ranges from 0.44 to 0.59:
blending equivalent ratio between acid anhydrides and epoxy resins=(X+Y)/Z (2)
where X represents the functional group number of acid anhydride groups in the acid anhydrides (A), Y represents the functional group number of carboxyl groups in the acid anhydrides (A), and Z represents the functional group number of epoxy groups in the epoxy resins (B).

2. The epoxy resin composition according to claim 1, further comprising 0.1 to 5 mass % of a hindered phenol-based antioxidant.

3. The epoxy resin composition according to claim 1, further comprising a fluorescent substance capable of emitting fluorescence after absorbing at least part of light emitted from a light emitting element, wherein the light emitting element has a main emission peak wavelength of 550 nm or less.

4. An epoxy resin cured product obtained by curing the epoxy resin composition according to claim 1.

5. A light emitting diode comprising a light emitting element encapsulated with the epoxy resin cured product according to claim 4.

6. An epoxy resin composition, comprising:
acid anhydrides (A); and
epoxy resins (B),
wherein:
(a) cyclohexane-1,2,4-tricarboxylic acid-1,2-anhydride accounts for 50 to 90 mass % of the acid anhydrides (A) and the remainder being hexahydrophthalic anhydride and/or methylhexahydrophthalic anhydride;
(b) 3,4-epoxycyclohexylmethyl-3',4'-epoxycyclohexanecarboxylate accounts for 30 to 90 mass % of the epoxy resins (B) and tripropylene glycol diglycidyl ether accounts for 10 to 50 mass% of the epoxy resins (B), and in the case that the epoxy resin (B) further contains an epoxy resins compound a nucleus-hydrogenated product of a bisphenol A-type epoxy resin accounts for the rest of the epoxy resins (B); and
(c) contents of the acid anhydrides (A) and the epoxy resins (B) are such that a blending equivalent ratio between the acid anhydrides and the epoxy resins represented by the following formula (2) ranges from 0.4 to 0.7:
blending equivalent ratio between acid anhydrides and epoxy resins=(X+Y)/Z (2)
where X represents the functional group number of acid anhydride groups in the acid anhydrides (A), Y represents the functional group number of carboxyl groups in the acid anhydrides (A), and Z represents the functional group number of epoxy groups in the epoxy resins (B).

7. The epoxy resin composition according to claim 6, further comprising 0.1 to 5 mass % of a hindered phenol-based antioxidant.

8. The epoxy resin composition according to claim 6, further comprising a fluorescent substance capable of emitting fluorescence after absorbing at least part of light emitted from a light emitting element, wherein the light emitting element has a main emission peak wavelength of 550 nm or less.

9. An epoxy resin cured product obtained by curing the epoxy resin composition according to claim 6.

10. A light emitting diode comprising a light emitting element encapsulated with the epoxy resin cured product according to claim 9.

11. An epoxy resin composition, comprising:
acid anhydrides (A); and
epoxy resins (B),
wherein:
(a) cyclohexane-1,2,4-tricarboxylic acid-1,2-anhydride accounts for 50 to 90 mass % of the acid anhydrides (A) and the remainder being hexahydrophthalic anhydride and/or methylhexahydrophthalic anhydride;
(b) epoxy resins (B) comprise 3,4-epoxycyclohexylmethyl-3',4'-epoxycyclohexanecarboxylate accounting for 30 to 90 mass % of the epoxy resins (B) and an epoxy resin compound represented by the following formula (1) accounting for 10 to 50 mass % of the epoxy resins (B), wherein said epoxy resin compound represented by the following formula (1) is hexane-1,6-diglycidyl ether and tripropylene glycol diglycidyl ether, and in the case that the epoxy resin (B) further contains an epoxy resins compound a nucleus-hydrogenated product of a bisphenol A-type epoxy resin accounts for the rest of the epoxy resins (B); and (c) contents of the acid anhydrides (A) and the epoxy resins (B) are such that a blending equivalent ratio between the acid anhydrides and the epoxy resins represented by the following formula (2) ranges from 0.4 to 0.7:

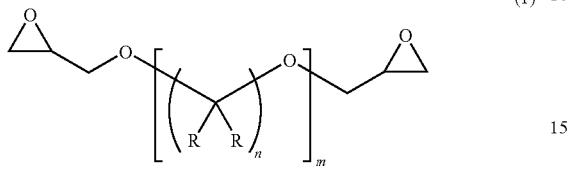

(1)

where R's each independently represent a hydrogen atom or a methyl group, m represents an integer of 1 to 3, and n represents an integer of 2 to 8, blending equivalent ratio between acid anhydrides and epoxy resins=(X+Y)/Z (2)

where X represents the functional group number of acid anhydride groups in the acid anhydrides (A), Y represents the functional group number of carboxyl groups in the acid anhydrides (A), and Z represents the functional group number of epoxy groups in the epoxy resins (B).

12. The epoxy resin composition according to claim 11, further comprising 0.1 to 5 mass % of a hindered phenol-based antioxidant.

13. The epoxy resin composition according to claim 11, further comprising a fluorescent substance capable of emitting fluorescence after absorbing at least part of light emitted from a light emitting element, wherein the light emitting element has a main emission peak wavelength of 550 nm or less.

14. An epoxy resin cured product obtained by curing the epoxy resin composition according to claim 11.

15. A light emitting diode comprising a light emitting element encapsulated with the epoxy resin cured product according to claim 14.

16. An epoxy resin composition, comprising:
acid anhydrides (A); and
epoxy resins (B),
wherein:
(a) cyclohexane-1,2,4-tricarboxylic acid-1,2-anhydride accounts for 50 to 90 mass % of the acid anhydrides (A) and the remainder being hexahydrophthalic anhydride and/or methylhexahydrophthalic anhydride;

(b) epoxy resins (B) comprise 3,4-epoxycyclohexylmethyl-3',4'-epoxycyclohexanecarboxylate accounting for 30 to 90 mass % of the epoxy resins (B), an epoxy resin compound represented by the following formula (1) accounting for 10 to 50 mass % of the epoxy resins (B), and a nucleus-hydrogenated product of a bisphenol A-type epoxy resin accounting for the rest of epoxy resins (B), wherein said epoxy resin compound represented by the following formula (1) is hexane-1,6-diglycidyl ether and/or tripropylene glycol diglycidyl ether; and (c) contents of the acid anhydrides (A) and the epoxy resins (B) are such that a blending equivalent ratio between the acid anhydrides and the epoxy resins represented by the following formula (2) ranges from 0.4 to 0.7:

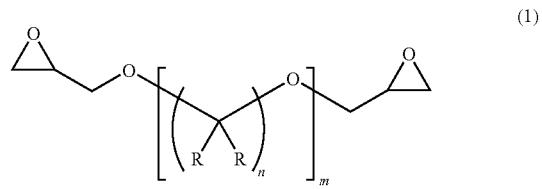

(1)

where R's each independently represent a hydrogen atom or a methyl group, m represents an integer of 1 to 3, and n represents an integer of 2 to 8, blending equivalent ratio between acid anhydrides and epoxy resins=(X+Y)/Z (2)

where X represents the functional group number of acid anhydride groups in the acid anhydrides (A), Y represents the functional group number of carboxyl groups in the acid anhydrides (A), and Z represents the functional group number of epoxy groups in the epoxy resins (B).

17. The epoxy resin composition according to claim 16, further comprising 0.1 to 5 mass % of a hindered phenol-based antioxidant.

18. The epoxy resin composition according to claim 16, further comprising a fluorescent substance capable of emitting fluorescence after absorbing at least part of light emitted from a light emitting element, wherein the light emitting element has a main emission peak wavelength of 550 nm or less.

19. An epoxy resin cured product obtained by curing the epoxy resin composition according to claim 16.

20. A light emitting diode comprising a light emitting element encapsulated with the epoxy resin cured product according to claim 19.

* * * * *